(12) United States Patent
Aonuma

(10) Patent No.: US 9,136,496 B2
(45) Date of Patent: Sep. 15, 2015

(54) ORGANIC EL DEVICE

(71) Applicant: PANASONIC CORPORATION, Osaka (JP)

(72) Inventor: Masaki Aonuma, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/396,134

(22) PCT Filed: Nov. 13, 2013

(86) PCT No.: PCT/JP2013/006672
§ 371 (c)(1),
(2) Date: Oct. 22, 2014

(87) PCT Pub. No.: WO2014/108949
PCT Pub. Date: Jul. 17, 2014

(65) Prior Publication Data
US 2015/0060805 A1  Mar. 5, 2015

(30) Foreign Application Priority Data

Jan. 8, 2013  (JP) ................ 2013-001122

(51) Int. Cl.
*H01L 51/50* (2006.01)
*H01L 51/52* (2006.01)
*H01L 51/00* (2006.01)

(52) U.S. Cl.
CPC ........ *H01L 51/5072* (2013.01); *H01L 51/5234* (2013.01); *H01L 51/0084* (2013.01); *H01L 2251/5315* (2013.01); *H01L 2251/55* (2013.01); *H01L 2251/558* (2013.01)

(58) Field of Classification Search
CPC ..... H01L 51/50; H01L 51/52; H01L 51/5072; H01L 51/5234; H01L 51/504; H01L 51/5016; H01L 31/00; H01L 33/00; H01L 51/56; H01L 33/12
USPC ............. 257/43, 40, 57, 59, 79, 89, 98, 642, 257/643, 759
See application file for complete search history.

(56) References Cited

U.S. PATENT DOCUMENTS 5,216,331 A * 6/1993 Hosokawa et al. ........ 315/169.3
2011/0248249 A1* 10/2011 Forrest et al. .................. 257/40
2014/0077188 A1   3/2014 Aonuma et al.

FOREIGN PATENT DOCUMENTS

| JP | 2011-060468 | 3/2011 |
| JP | 2013-004368 | 1/2013 |
| JP | 2013-137973 | 7/2013 |
| WO | 2013/118210 | 8/2013 |

* cited by examiner

*Primary Examiner* — Chuong A Luu
(74) *Attorney, Agent, or Firm* — Greenblum & Bernstein, P.L.C.

(57) ABSTRACT

An organic EL device including: a substrate; an anode disposed on the substrate; a functional layer disposed on the anode, the functional layer containing a light-emitting layer; an electron transport layer disposed on the functional layer, the electron transport layer containing organic compound-containing material; and a cathode disposed on the electron transport layer so as to be in contact with the electron transport layer, the cathode being light-transmissive. The electron transport layer has a relative permittivity of no less than 2 and no greater than 10 when supplied with an AC voltage having a frequency of 1 MHz.

6 Claims, 5 Drawing Sheets

ORGANIC EL DEVICE

TECHNICAL FIELD

The present invention relates to organic EL devices, and in particular to improvements in an electron transport layer for ensuring electron injection from a cathode to a light-emitting layer.

BACKGROUND ART

Some organic electroluminescence (EL) devices have an anode, a functional layer containing at least a light-emitting layer (e.g., functional layers composed of a hole injection layer, a hole transport layer and a light-emitting layer) and a cathode, which are stacked on a substrate in this order, and emit light from the side closer to the cathode.

Among such organic EL devices, some devices are additionally provided with an electron transport layer that contains organic compound-containing material and that is located between the functional layer and the cathode, aiming to improve electron injection to the light-emitting layer. The cathode is formed on the electron transport layer by, for example, a thin film formation method such as a vapor deposition method or a sputtering method.

CITATION LIST

Patent Literature

[Patent Literature 1]
Japanese Patent Application Publication No. 2011-60468

SUMMARY OF INVENTION

Technical Problem

However, since the electron transport layer contains organic compound-containing material, the constituents of the surface thereof are likely to be thermally dissociated and to degrade, during formation of the cathode by the thin film formation method. Such a degraded layer would be a cause of degradation in device performance, such as degradation in electron injection to the light-emitting layer and a rise of the light-emission start voltage.

Therefore, it is desired to realize a high-performance organic EL device by preventing the degraded layer from impairing the purpose of the electron transport layer.

The present invention is made in view of the above-described demand, and aims to enable the electron transport layer to properly fulfill the purpose thereof, thereby providing a high-performance organic EL device.

Solution to Problem

To fulfill the aim, one aspect of the present invention provides an organic EL device comprising: a substrate; an anode disposed on the substrate; a functional layer disposed on the anode, the functional layer including a light-emitting layer; an electron transport layer disposed on the functional layer, the electron transport layer containing organic compound-containing material; and a cathode disposed on the electron transport layer and in contact with the electron transport layer, the cathode being light-transmissive, wherein the electron transport layer has a relative permittivity of no less than 2 and no greater than 10 when supplied with an AC voltage having a frequency of no less than 1 MHz and no greater than 1 GHz.

Effects of Invention

In the organic EL device pertaining to one aspect of the present invention, the electron transport layer has a relative permittivity of no less than 2 and no greater than 10, which reduces the influence of the degraded layer formed in the electron transport layer during formation of the cathode, and leads to a high-performance organic EL device.

DESCRIPTION OF EMBODIMENTS

<<Background Leading To Embodiment>>

Figure 1:
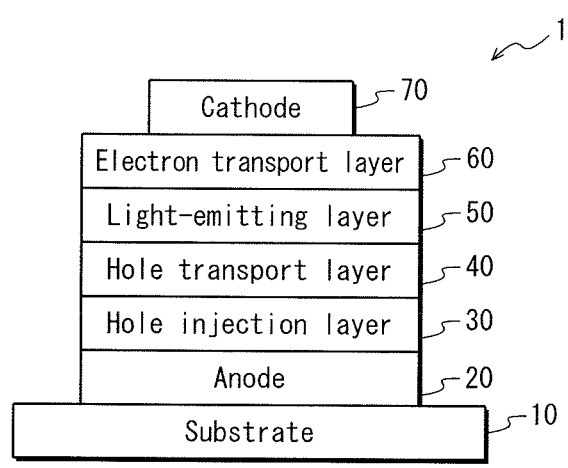
FIG. 1 is a schematic cross-sectional view showing an organic EL device 1 pertaining to an embodiment of the present invention.

The inventor of the present invention prepared organic EL devices each having, on an electron transport layer, a cathode formed from ITO under various conditions by a thin film formation method. First, the inventor observed the surface of the cathode of each organic EL device by using a scanning electron microscope (SEM). By the observation, the inventor confirmed that the state of the surface of the cathode varies depending on film forming conditions. Furthermore, the inventors conducted a measurement by back side secondary ion mass spectrometry (BS-SIMS), and confirmed that the penetration depth of indium (In) and the penetration depth of oxygen (O) vary depending on the film forming conditions. Penetration depth refers to the distance from where oxygen (O) or indium (In) is detected in the electron transport layer, to the cathode. Considering these results, the inventor of the present invention posited that the interface of the electron transport layer with the cathode was degraded, and a degraded layer was formed.

Considering the results of the above-described observation and measurement, the inventor confirmed that the performance of an organic EL device varies in relation to the size of the degraded area in the electron transport layer. Although the physical state of the degraded layer formed in the electron transport layer was unknown, the inventor found that the degraded layer had an influence on the performance of the organic EL.

The inventor therefore attempted to obtain a physical variable that appropriately indicates the relationship between the degraded layer and the device performance, with respect to an electron transport layer. In a practical device having a multi-layer structure, however, the influences of the plurality of layers are combined together. It was therefore difficult to separate the influence of the electron transport layer on the device performance from the other influences, and consequently, the inventor was unable to obtain a result that properly indicates the physical state of the degraded layer. For this reason, the inventor carried out the observation by using an evaluation element including only an anode, an electron transport layer and a cathode which are respectively formed from the same materials as these layers of the practical device and stacked in the stated order.

The inventor measured physical variables such as the sheet resistance, the work function, and the reflectivity. Nevertheless, it was impossible to obtain a result that properly indicates the physical state of the degraded layer. The inventor presumed that this was because the electron transport layer had a layer thickness on the order of nanometers as described above, and it was difficult to accurately detect changes in the physical state of the degraded layer.

After carefully reviewing the way of measurement, taking into consideration the measuring limit of measurement devices at the time, the inventor focused on the fact that the electron transport layer approximates in properties to a dielectric, because the electron transport layer can be regarded as being basically insulative. With regards to measurement devices, an impedance resistance measurement device (e.g. dielectric measurement system, model 126096W (TOYO corporation)) covers measurement of high-resistance samples satisfying $|Z|>100$ MΩ for example, and the measurement conditions can be varied within a wide range from the order of MHz to GHz. Furthermore, the resolution ranges relatively widely.

Focusing on these points, the inventor measured the relative permittivity of the electron transport layer, in particular the composite relative permittivity of the combination of the degraded layer and a main body layer as the residual layer. As a result, the inventor found that the relative permittivity of the electron transport layer properly indicated the relationship with the device function.

Note that, in the present description, the "relative permittivity" of the electron transport layer is represented by the relative permittivity of the electron transport layer included in an evaluation element, in which only an anode, the electron transport layer, and a cathode, respectively formed from the same materials as these layers of a practical device, are stacked in the stated order. This is because it is difficult to accurately measure the relative permittivity of the electron transport layer of a practical device. The relative permittivity of the electron transport layer of the evaluation element is considered as being equivalent to the relative permittivity of the electron transport layer of a practical device.

<<Characteristic Structure of One Aspect of the Present Invention>>

An organic EL device pertaining to one aspect of the present invention is an organic EL device comprising: a substrate; an anode disposed on the substrate; a functional layer disposed on the anode, the functional layer including a light-emitting layer; an electron transport layer disposed on the functional layer, the electron transport layer containing organic compound-containing material; and a cathode disposed on the electron transport layer and in contact with the electron transport layer, the cathode being light-transmissive, wherein the electron transport layer has a relative permittivity of no less than 2 and no greater than 10 when supplied with an AC voltage having a frequency of no less than 1 MHz and no greater than 1 GHz.

In the organic EL device pertaining to one aspect of the present invention, the electron transport layer may have a layer thickness of no less than 30 nm and no greater than 150 nm.

In the organic EL device pertaining to one aspect of the present invention, the cathode may be formed by magnetron sputtering.

In the organic EL device pertaining to one aspect of the present invention, the cathode may contain an electrically conductive oxide-containing material that contains at least one of In, Sn, Ti, Al, Zn and Ga in addition to O.

<<Embodiment>>

FIG. 1 is a schematic cross-sectional view showing an organic EL device 1 pertaining to an embodiment.

As shown in FIG. 1, the organic EL device 1 includes a substrate 10 on which an anode 20, a hole injection layer 30, a hole transport layer 40, a light-emitting layer 50, an electron transport layer 60 and a cathode 70 are sequentially layered. Here, the set of the hole injection layer 30, the hole transport layer 40 and the light-emitting layer 50 corresponds to the functional layer of the present invention.

[Components]

<Substrate>

The substrate 10 is a thin-film transistor (TFT) substrate which is well known in the art, and a TFT (not depicted in the drawing) for driving the light-emitting layer 50 is formed on the surface of the base body of the substrate 10.

The base body of the substrate 10 is formed from an insulating material, such as glass material, resin material, or alumina.

<Anode>

The anode 20 is formed from an electrically-conductive material, and has a thickness of approximately 200 nm, for example.

The anode 20 is formed from, for example, an alloy material such as aluminum alloy, APC (an alloy of silver, palladium and copper), or ARA (an alloy of silver, rubidium and gold).

The anode 20 is formed by, for example, a vacuum deposition method or a sputtering method.

The anode 20 also serves as a reflector for reflecting the light from the light-emitting layer 50 toward the light-emission side (i.e. the side closer to the cathode 70).

<Hole Injection Layer>

The hole injection layer 30 is formed from, for example, a metal oxide such as $MoO_x$ (molybdenum oxide), $WO_x$ (tungsten oxide), or $Mo_xW_yO_z$ (molybdenum-tungsten oxide), and formed by a reactive sputtering method.

<Hole Transport Layer>

The hole transport layer 40 is formed from, for example, an organic high-polymer amine-containing material such as (4-Butylphenyl)diphenylamine (TFB), aromatic tertiary amine compound, or styrylamine compound, and is formed by applying and drying ink containing the material. The hole transport layer 40 has a thickness of 20 nm for example.

<Light-emitting Layer>

The light-emitting layer 50 is formed from, for example, F8-F6 (copolymer composed of F8 (polydioctylfluorene) and F6 (polydihexylfluorene)), and is formed by applying and drying ink containing the material.

<Electron Transport Layer>

The electron transport layer 60 is formed by a vacuum deposition method for example, and has a thickness of no less than 30 nm and no greater than 150 nm for example.

The electron transport layer 60 is formed from an organic compound-containing material. For example, a material including an n-type dopant material having electron injection properties and a host material (organic compound) having electron transport properties is used. More specifically, the electron transport layer 60 may be formed from a charge transfer (CT) complex.

The electron transport layer 60 has a relative permittivity of no less than 2 and no greater than 10 when supplied with an AC voltage having a frequency of 1 MHz.

<Cathode>

The cathode 70 is formed from a light-transmissive electrically-conductive material, and is formed by, for example, a thin film formation method, a vacuum deposition method, or a sputtering method. The light-transmissive electrically-conductive material of the cathode 70 is, for example, an electrically-conductive oxide that contains at least one of In, Sn, Ti, Al, Zn and Ga in addition to O. Specifically, ITO (indium tin oxide), IZO (indium zinc oxide), or IGZO (indium gallium zinc oxide) may be used.

[Light Emission]

The organic EL device 1 is a top-emission type device, and the light from the light-emitting layer 50 is emitted from the side of the device that is closer to the cathode 70 than the other side.

Specifically, in the organic EL device 1, holes are efficiently injected from the hole injection layer 30 and the hole transport layer 40 to the light-emitting layer 50, and electrons are efficiently injected from the electron transport layer 60 to the light-emitting layer 50, and the light-emitting layer 50 emits light by recombining the carriers (i.e. holes and electrons).

The anode 20 is light-reflective, and the cathode 70 is light-transmissive. Therefore, the light from the light-emitting layer 50 is efficiently emitted from the side closer to the cathode 70.

<<Relative Permittivity of Electron Transport Layer>>

Figure 2A:
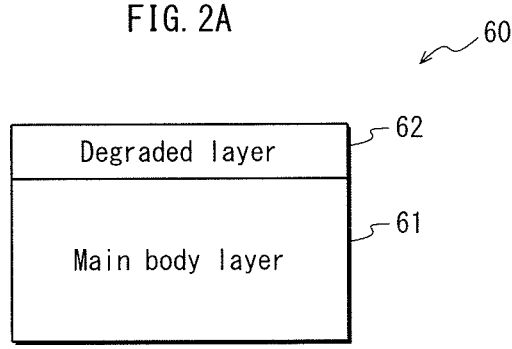
FIG. 2A is a schematic dross-sectional view showing the structure of an electron transport layer 60 pertaining to an embodiment of the present invention.
Figure 2B:
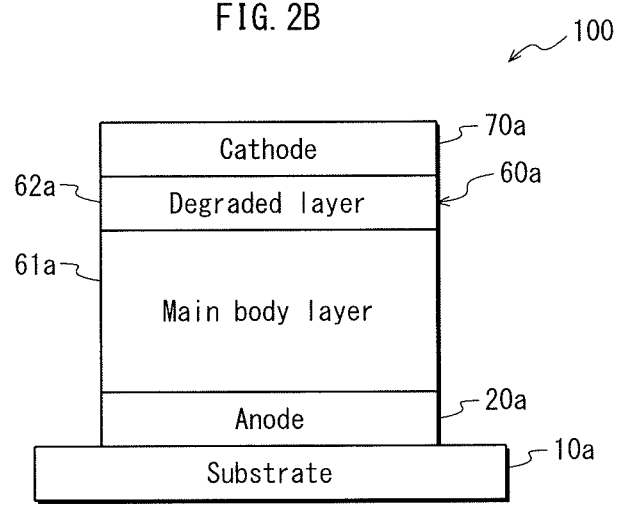
FIG. 2B is a schematic cross-sectional view showing the structure of an evaluation element 100 pertaining to an embodiment of the present invention.
Figure 2C:
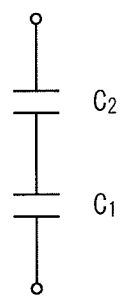
FIG. 2C shows an equivalent circuit of the evaluation element 100.

FIG. 2A is a schematic cross-sectional view showing the electron transport layer 60 pertaining to an embodiment of the present invention. FIG. 2B is a schematic cross-sectional view showing an evaluation element 100 pertaining to an embodiment of the present invention, and FIG. 2C shows an equivalent circuit of the evaluation element 100.

<Degraded Layer>

As shown in FIG. 2A, the electron transport layer 60 is composed of a main body layer 61 and a degraded layer 62.

The degraded layer 62 is a portion of the electron transport layer 60 that has been degraded by thermal energy applied to the surface of the electron transport layer 60 during formation of the cathode 70 on the electron transport layer 60 by a thin film formation method. The degraded layer 62 has a layer thickness of no greater than approximately 15 nm, for example. This thickness, however, varies depending on conditions for forming the cathode 70 and the material of the electron transport layer 60.

The degraded layer of the present embodiment may contain an undegraded portion as well as a degraded portion. The layer thickness of the degraded layer is, as described above, represented by the penetration depth of indium (In) or oxygen (O) measured by BS-SIMS.

<Evaluation Element>

The evaluation element 100 is a device used for measuring the relative permittivity of the electron transport layer. As described above, it is difficult to accurately measure the relative permittivity of the electron transport layer 60 in the organic EL device 1. Therefore, the inventor substituted the relative permittivity of an electron transport layer 60a, which is equivalent to the electron transport layer 60, for the relative permittivity of the electron transport layer 60.

As shown in FIG. 2B, the evaluation element 100 includes an anode 20a, an electron transport layer 60a and a cathode 70a which are sequentially stacked on a substrate 10a. The substrate 10a, the anode 20a, the electron transport layer 60a and the cathode 70a are formed under the same conditions as the substrate 10, the anode 20, the electron transport layer 60 and the cathode 70 of the organic EL device 1 shown in FIG. 1, respectively.

<Relative Permittivity>

The electron transport layer 60a does not have carriers, but has a function to transport electrons injected thereto. The electron transport layer 60a is basically insulative, and approximates in properties to a dielectric. In other words, as shown in FIG. 2C, the main body layer 61a can be regarded as a capacitor having capacitance C1 and the degraded layer 62a can be regarded as a capacitor having capacitance C2, and accordingly the electron transport layer 60a composed of the main body layer 61a and the degraded layer 62a can be regarded as the combination of these capacitors that are connected in series.

Specifically, the surface of the main body layer 61a and the surface of the degraded layer 62a have the same area (along the orthogonal directions to the thickness direction). The layer thickness of the main body layer 61a and the layer thickness of the degraded layer 62a are both on the order of nanometers, and the difference therebetween is extremely small. Therefore, it can be assumed that the primary parameter that causes the difference between the capacitances is the relative permittivity.

Hence, the relative permittivity of the electron transport layer 60a, specifically, the composite relative permittivity of the main body layer 61a and the degraded layer 62a is adopted as the parameter indicating the properties of the electron transport layer 60 related to the degraded layer 62.

<<Verification Test>>

The inventor of the present invention conducted a verification test in order to verify the relationship between the relative permittivity of the electron transport layer and the device performance. In the verification test, the electronic current and the lifespan, which are representative indicators of the device performance, were measured with respect to organic EL devices with cathodes formed under various conditions. At the same time, an evaluation element was manufactured under the same conditions as the aforementioned organic EL devices, and the relative permittivity of the electron transport layer was measured. The following explains the results of the verification.

<<Relationship between Device Function and Relative Permittivity of Electron Transport Layer>>

Figure 3A:
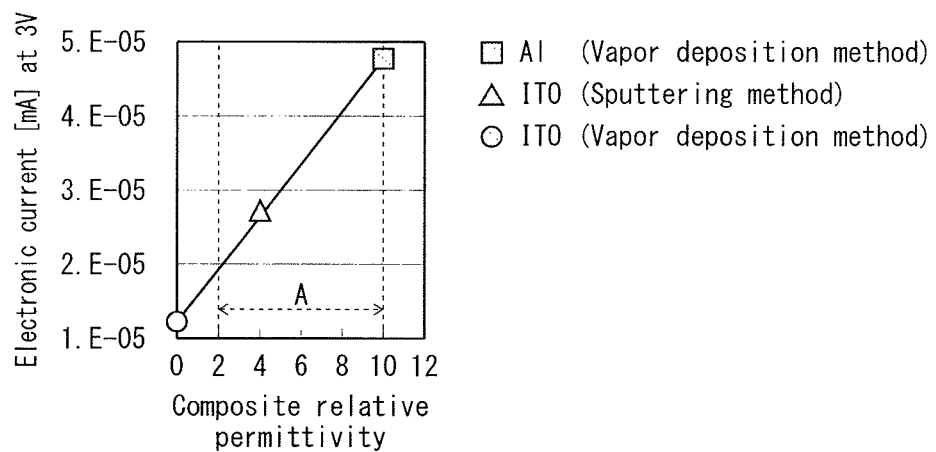
FIG. 3A shows a relationship between the composite relative permittivity of an electron transport layer and the magnitude of electronic current.
Figure 3B:
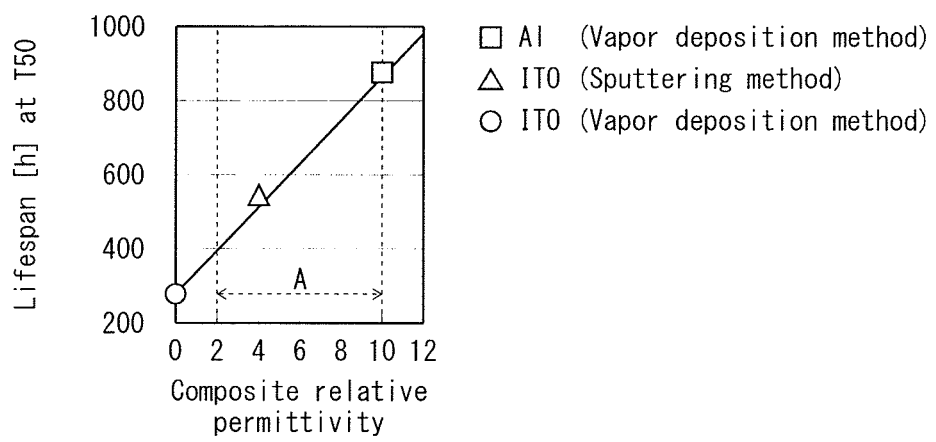
FIG. 3B shows a relationship between the composite relative permittivity of an electron transport layer and the life span.

FIGS. 3A and 3B are verification results showing the relationship between the composite relative permittivity of the electron transport layer and the device performance (the electronic current and the lifespan). FIG. 3A shows the relationship between the composite relative permittivity and the electronic current, and FIG. 3B shows the relationship between the composite relative permittivity and the lifespan. Here, a voltage realizing an initial luminance of 8000 cd/m$^2$ is applied to each device, and the lifespan refers to a time period until the luminance of the device decreases to the half of the initial luminance when the voltage is maintained at the same level.

The conditions for forming the cathodes of the organic EL device samples and the evaluation elements used in the verification test are as follows. The hatched squares shown in FIG. 3A and FIG. 3B correspond to a cathode formed from Al by a vapor deposition method, and the formation conditions are: resistance heating is applied; film formation rate is at 1 nm/s; and substrate temperature is at 50° C. The hatched triangles shown in FIG. 3A and FIG. 3B correspond to a cathode formed from ITO by a sputtering method, and the formation conditions are: a magnetron sputtering method is used; the gas pressure is at 0.6 Pa; the argon flow rate is at 200 sccm ($3.38 \times 10^{-2}$ Pa·m$^3$/sec); the oxygen flow rate is at 10 sccm ($1.69 \times 10^{-3}$ Pa·m$^3$/sec); the discharge power is at 5.4 W/cm$^2$; and the frequency is at 250 kHz. The shaded circles shown in FIG. 3A and FIG. 3B correspond to the cathode 70*a* formed from ITO by a vapor deposition method, and the formation conditions are: a plasma gun method is used; the gas pressure is at 0.7 Pa; the argon flow rate is at 300 sccm ($5.07 \times 10^{-2}$ Pa·m$^3$/sec), and the oxygen flow rate is at 35 sccm ($5.915 \times 10^{-3}$ Pa·m$^3$/sec), and the vapor flow rate is at 5 sccm ($8.45 \times 10^{-4}$ Pa·m$^3$/sec); and the substrate temperature is at 50° C. Further, the layer thickness of the electron transport layer is 80 nm, and the relative permittivity of the electron transport layer was measured by measuring the capacitance by using an impedance resistance measurement device, under the following conditions: the DC voltage is at 5 V; the AC voltage is at 200 mV; and the frequency is at 1 MHz.

FIG. 3A shows values of the composite relative permittivity and the electronic current, plotted in a straight line by the least square method. As shown in FIG. 3A, the inventor obtained a result that the electronic current increases linearly along with increased composite relative permittivity. Presumably, this is because of the difference in density of a double layer appearing at the interface of the electron transport layer, due to the difference in composite relative permittivity. In other words, the energy barrier at the interface between the electron transport layer and the cathode decreases along with increased electric field strength resulting from increased density of a double layer, and accordingly the resistance decreases and the electron injection properties improve.

Presumably, it is possible to obtain preferable device performance when the electronic current is no less than 2.E-05 mA. As seen from FIG. 3A, the electronic current is approximately equal to 2.E-05 mA when the composite relative permittivity is 2. Therefore, it is preferable that the composite relative permittivity of the electron transport layer is at least 2.

Furthermore, an observation by an SEM shows that the electron transport layers of the devices in which the cathode is formed from Al by a vapor deposition (corresponding to hatched squares in FIG. 3A and FIG. 3B) are unlikely to degrade compared to the other devices. Therefore, presumably it suffices if the upper limit of the composite relative permittivity of the electron transport layer is 10.

Furthermore, as shown in FIG. 3A, the electronic current in the cathode formed from ITO is smaller than in the cathode formed from Al. Presumably, there are two reasons. The first reason is that, when ITO is used, unlike when Al is used, it is necessary to have particles with relatively high energy reach the surface of the electron transport layer by a sputtering method in order to properly form a uniform film of ITO on the electron transport layer, and a vapor deposition method is not sufficient in terms of the particle energy. In other words, it can be assumed that, when a cathode is formed from ITO by a vapor deposition method, the electronic current is small due to an area where the film of ITO is not formed uniformly. The second reason is that, when a sputtering method is used, particles reaching the surface of the electron transport layer have higher energy compared to a vapor deposition method, and the surface of the electron transport layer is more likely to degrade. In other words, when the cathode is formed from ITO by a sputtering method, although the uniform film of ITO (i.e. the cathode) having excellent properties can be formed, a degraded layer is likely to be formed in the electron transport layer, and accordingly the electronic current becomes small.

Next, as shown in FIG. 3B, the result with respect to the lifespan is similar to the result with respect to the electronic current. That is, it is observed that the lifespan increased along with increased composite relative permittivity of the electron transport layer. This is presumably because, as with the electronic current described above, the resistance at the interface between the cathode and the electron transport layer decreases and accordingly the light-emission start voltage decreases.

Furthermore, as with the result with respect to the electronic current, a lifespan that realizes preferable device performance can be obtained when the composite relative permittivity of the electron transport layer is no less than 2 and no greater than 10 (the range depicted as dotted double arrow A in FIG. 3B).

As explained above, when the composite relative permittivity of the electron transport layer is set to be no less than 2 and no greater than 10, the degradation of the device performance caused by the degraded layer is suppressed and a high-performance organic EL device can be obtained.

In particular, when the cathode is formed by a sputtering method, the degraded layer is likely to be formed in the electron transport layer, and the properties of the electron transport layer are likely to be degraded. Even in this case, however, it is possible to enable the electron transport layer to exhibit the properties thereof properly by setting the relative permittivity of the electron transport layer to be no less than 2 and no greater than 10.

Also, both the light-transmission and the electrical conductivity of the cathode can be improved by forming the cathode from an electrically-conductive oxide containing at least one of In, Sn, Ti, Al, Zn and Ga in addition to O. For example, ITO, IZO (indium zinc oxide), or IGZO (indium gallium zinc oxide) may be used as the material of the cathode. When such materials are used, it is necessary to form the cathode by a sputtering method as described above. Even in this case, however, it is possible to enable the electron transport layer to exhibit the properties thereof properly by setting the relative permittivity of the electron transport layer to be no less than 2 and no greater than 10.

(Frequency Dependence of Composite Relative Permittivity of Electron Transport Layer)

Figure 4:
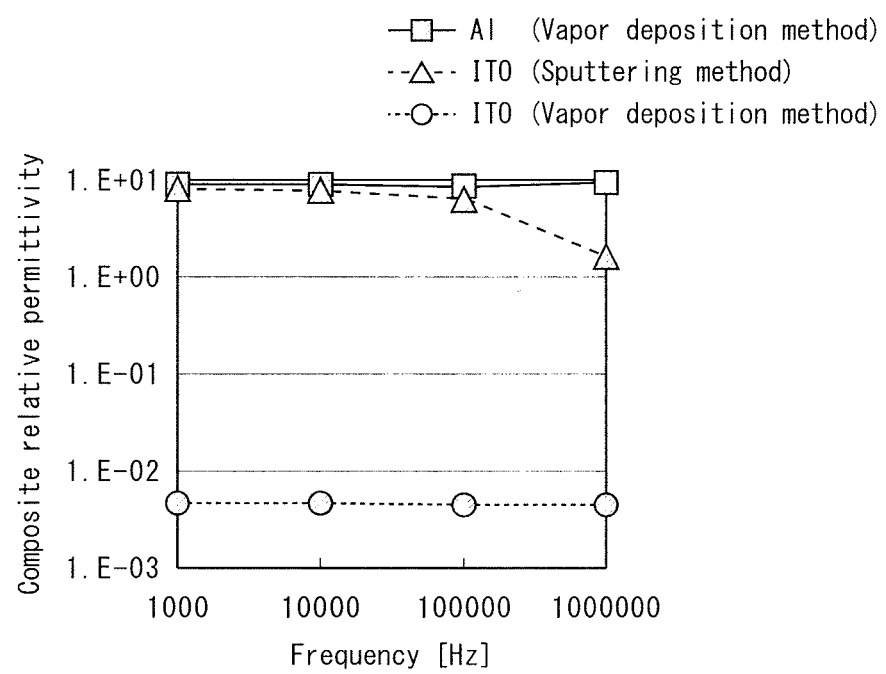
FIG. 4 shows a relationship between the composite relative permittivity of an electron transport layer and the frequency of an AC voltage pertaining to relative permittivity measurement.

FIG. 4 shows the relationship between the composite relative permittivity of the electron transport layer and the frequency of the AC voltage applied at the measurement.

The conditions for forming the cathode shown in FIG. 4 are the same as the conditions shown in FIG. 3A and FIG. 3B. Also, the conditions for measuring the composite relative permittivity are the same as the conditions shown in FIG. 3A and FIG. 3B, except that the frequency is changed. The layer thickness of the electron transport layer is 80 nm.

As shown in FIG. 4, when the frequency is within the range of 1000 Hz to 100000 Hz, no significant difference is found among the samples with respect to the composite relative permittivity of the electron transport layer. However, when the frequency is 1000000 Hz (i.e. 1 MHz), the relative permittivity is low in the organic EL device sample in which the cathode is formed from ITO by a sputtering method as depicted in FIG. 4 as a hatched triangle, which shows a significant frequency dependence.

The degraded layer is formed in the electron transport layer when the composition or the properties of the electron transport layer are changed according to the conditions for forming the cathode. For example, there would be a case in which the electron transport layer is not formed uniformly on a plane, and is formed as a set of a plurality of crystalized areas. Therefore, there would be a case in which the polarization susceptibility of the degraded layer to the external electric filed varies among the areas and it is difficult to obtain a relative permittivity of the electron transport layer that properly indicates the physical state of the degraded layer without applying a high-frequency AC voltage. In other words, when an AC voltage having a low frequency of 1000 Hz to 10000 Hz is applied, there are possibilities that the composite relative permittivity of the electron transport layer does not properly reflect the physical state of the degraded layer even if the composite relative permittivity of the electron transport layer is within the range of 2 to 10. In such cases, it is possibly unable to obtain sufficient electronic current and lifespan.

Therefore, as shown in FIG. 4, the relative permittivity is measured while applying an AC voltage having a frequency of 1 MHz (i.e. 1000000 Hz), in order to obtain the composite relative permittivity of the electron transport layer that properly reflects the physical state of the degraded layer.

Note that the frequency of the AC voltage to be applied only needs to be no less than 1 MHz, and is not limited to any specific value. For example, considering measurement devices at the time, the upper limit is 1 GHz (i.e. 1000000000 Hz). That is, the electron transport layer is configured such that the composite relative permittivity of the electron transport layer is no less than 2 and no greater than 10 when supplied with an AC voltage having a frequency no less than 1 MHz and no greater than 1 GHz. Specifically, it suffices if the composite relative permittivity of the electron transport layer measures no less than 2 and no greater than 10 when the voltage has a given frequency that is no less than 1 MHz and no greater than 1 GHz. It is particularly preferable that the composite relative permittivity of the electron transport layer measures no less than 2 and no greater than 10 whenever the voltage has a frequency that is no less than 1 MHz and no greater than 1 GHz.

Note that although not depicted in FIG. 4, the electron transport layer supplied with an AC voltage having a frequency of 5 MHz exhibited almost the same composite relative permittivity as the case of a frequency of 1 MHz.

(Film Thickness Dependence of Relative Permittivity of Electron Transport Layer)

Figure 5:
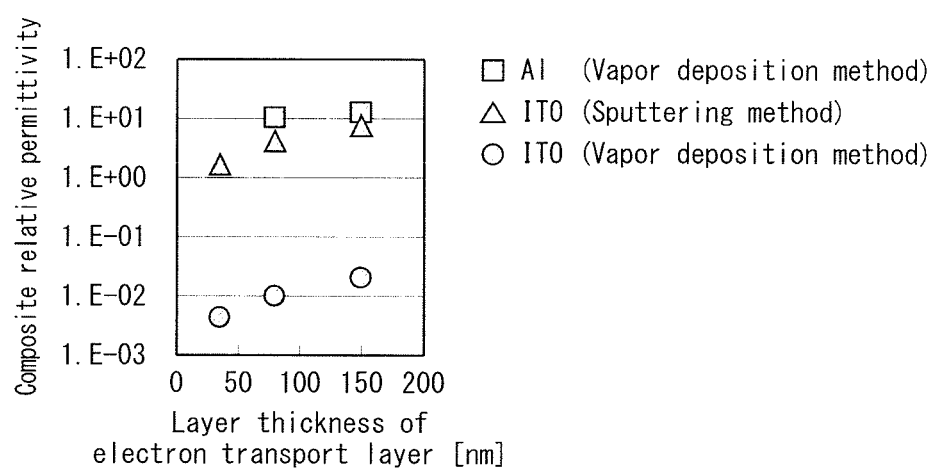
FIG. 5 shows a relationship between the composite relative permittivity of an electron transport layer and the layer thickness of the electron transport layer.

FIG. 5 shows the relationship between the composite relative permittivity of the electron transport layer and the layer thickness.

The conditions for forming the cathode shown in FIG. 5 are the same as the conditions shown in FIG. 3A and FIG. 3B. Also, the conditions for measuring the composite relative permittivity are the same as the conditions shown in FIG. 3A and FIG. 3B, except that the frequency is at 250 kHz.

As shown in FIG. 5, when the material is the same and the type of the thin-film formation method used for forming the cathode is the same, no significant difference is found with respect to the composite relative permittivity of the electron transport layer regardless of the layer thickness of the electron transport layer. In contrast, even when the material is the same (e.g. ITO) and the layer thickness is the same, the composite relative permittivity of the electron transport layer exhibits a significant difference if the type of the thin-film formation method is different. Presumably, this is because the physical state of the degraded layer formed on the surface and its vicinity of the electron transport layer more strongly depends on the type of the thin-film formation method used for forming the cathode rather than the layer thickness of the electron transport layer. In other words, when the layer thickness of the electron transport layer is on the order of nanometers, specifically within the range of 30 nm to 150 nm, the influence of the degraded layer upon the properties of the electron transport layer is unlikely to be reduced even if the layer thickness is increased, insofar as the material and the type of the thin-film formation method used for forming the cathode are the same.

Therefore, taking into consideration the measurement results shown in FIGS. 3A and 3B, it is particularly preferable when the layer thickness of the electron transport layer is no less than 30 nm and no greater than 150 nm to set the relative permittivity of the electron transport layer to be no less than 2 and no greater than 10 and thereby enable the electron transport layer to exhibit the properties thereof properly.

<<Other Considerations>>

The present invention has been described above based on Embodiment. However, the present invention is not limited to Embodiment, and may have any of the following configurations.

<Substrate>

The base body of the substrate may be formed from insulating material, such as alkali-free glass, soda glass, nonfluorescent glass, phosphate glass, borate glass, quartz, acrylic resin, styrenic resin, polycarbonate resin, epoxy resin, polyethylene, polyester, silicone resin or alumina.

<Anode>

The anode may include not only the reflective layer as in Embodiment, but also other layers. For example, the anode may include the reflective layer and a light-transmissive layer formed from light-transmissive electrically-conductive material, stacked sequentially. Alternatively, the anode may include only the light-transmissive layer. Also, the anode may include a plurality of layers formed from different materials and constitute a reflective layer.

In the anode, the reflective layer may be formed from an alloy, such as MoCr (an alloy of molybdenum and chromium) or NiCr (an alloy of nickel and chromium), and the light-transmissive material may be formed from, for example, an electrically-conductive oxide that contains at least one of In, Sn, Ti, Al, Zn and Ga in addition to O, such as ITO (indium tin oxide), IZO (indium zinc oxide), or IGZO (indium gallium zinc oxide).

<Hole Injection Layer>

The hole injection layer may be formed from metal oxide as in Embodiment, or from a nitride or oxynitride of the metal contained in the metal oxide.

<Hole Transport Layer>

The hole transport layer may be formed from, for example, oxadiazole derivative, imidazole derivative, polyarylalkane derivative, pyrazoline derivative and pyrazolone derivative, arylamine derivative, amino-substituted chalcone derivative, oxazole derivative, styrylanthracene derivative, fluorenone derivative, hydrazone derivative, stilbene derivative, porphyrin compound, butadiene compound, polystyrene derivative, hydrazone derivative, triphenylmethane derivative, or tetraphenyl benzine derivative.

<Light-emitting Layer>

The light-emitting layer may be formed from, for example, a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of a 8-hydroxyquinoline compound, metal complex of a 2-bipyridine compound, complex of a Schiff base and a group three metal, metal complex of oxine, or rare earth metal complex.

<Electron Transport Layer>

The electron transport layer may be formed from materials that form a CT complex, or a material composed only of an organic compound, or a material composed of an organic compound and an inorganic substance.

Regarding the materials that form a CT complex, examples of the host material include BCP (bathocuproin), Bphen (bathophenanthroline), $Alq_3$ (tris(8-hydroxyquinolinato)aluminium) or NTCDA (napthalenetetracarboxylic dianhydride), and examples of the n-type dopant material include an organic compound such as $CoCp_2$ (Cobaltocene), TTN (thallium(III) nitrate of dityrosine) or PyB (pyridinium betaine), $Ru(terpy)_2$ as a ruthenium complex or $Cr(bby)_3$ or $Cr(TMB)_3$ as a chrome complex, and alkaline metal or alkaline earth metal as an inorganic substance.

Here, depending on the combination of the host material and the n-type dopant or the film formation conditions, there is a possibility that the CT complex would not be formed. However, excellent electron transport properties can be realized by setting the difference between the HOMO level of the n-type dopant and the LUMO level of the host material as small as possible. For example, the level difference may be set to be smaller than a value within the range of 2 eV to 4 eV, preferably smaller than 1 eV.

<Cathode>

The cathode may be a metal layer of extremely thin film (e.g. with a thickness of 10 nm) formed from metal material such as Al. Alternatively, the cathode may be a laminate of the metal layer and the cathode of Embodiment.

The film formation conditions of the cathode are not limited to the conditions described in Embodiment above. For example, when ITO is used as the material thereof, the electrostatic discharge power may be set within the range of 4.5 $W/cm^2$ to 10 $W/cm^2$, the gas pressure may be set within the range of 0.3 Pa to 1.5 Pa, and the oxygen flow rate may be set within the range of 5.5 sccm to 11.5 sccm. When the electrostatic discharge power, the gas pressure and the oxygen flow rate fall within the respective ranges described above, the composite relative permittivity of the electron transport layer should fall within the range of 2 to 10.

<Passivation Layer>

A passivation layer may be formed on the cathode in order to prevent the light-emitting layer from degrading due to water, air, etc. The passivation layer may be formed from silicon nitride or silicon oxynitride for example.

<Organic EL Device>

The organic EL device is not limited to a single organic EL element pertaining to Embodiment, and may be an organic EL display panel having a plurality of organic EL elements mounted on the substrate, or an organic EL display device, for example.

INDUSTRIAL APPLICABILITY

The organic EL device pertaining to the present invention is appropriately applicable to an organic EL element, an organic EL panel and organic EL display device, for example.

REFERENCE SIGNS LIST 1 organic EL device
10 substrate
20 anode
30 hole injection layer
40 hole transport layer
50 light-emitting layer
60 electron transport layer
70 cathode

The invention claimed is:

1. An organic electroluminescence (EL) device, comprising:
    a substrate;
    an anode disposed on or above the substrate;
    one or more functional layers disposed on or above the anode, the one or more functional layers including a light-emitting layer;
    an electron transport layer disposed on or above the one or more functional layers, the electron transport layer containing organic compound-containing material; and
    a cathode disposed on the electron transport layer and in contact with the electron transport layer, the cathode being light-transmissive, wherein
    the electron transport layer has a relative permittivity of no less than 2 and no greater than 10 when supplied with an AC voltage having a frequency of no less than 1 MHz and no greater than 1 GHz, and
    the electron transport layer includes a degraded layer in which indium or oxygen penetrates the electron transport layer, a depth of the degraded layer being at most equal to 15 nm.

2. The organic EL device of claim 1, wherein
the electron transport layer has a layer thickness of no less than 30 nm and no greater than 150 nm.

3. The organic EL device of claim 1, wherein
the cathode is formed by magnetron sputtering.

4. The organic EL device of claim 2, wherein
the cathode is formed by magnetron sputtering.

5. The organic EL device of claim 3, wherein
the cathode contains an electrically conductive oxide-containing material that contains at least one of In, Sn, Ti, Al, Zn and Ga in addition to O.

6. The organic EL device of claim 4, wherein
the cathode contains an electrically conductive oxide-containing material that contains at least one of In, Sn, Ti, Al, Zn and Ga in addition to O.

* * * * *